(12) United States Patent
Kare et al.

(10) Patent No.: US 12,300,755 B2
(45) Date of Patent: May 13, 2025

(54) DEVICE FOR CONVERTING ELECTROMAGNETIC RADIATION INTO ELECTRICITY, AND RELATED SYSTEMS AND METHODS

(71) Applicant: LaserMotive, Inc., Kent, WA (US)

(72) Inventors: Jordin T. Kare, San Jose, CA (US); Thomas J. Nugent, Jr., Bellevue, WA (US); David Bashford, Kent, WA (US)

(73) Assignee: LaserMotive, Inc., Kent, WA (US)

( * ) Notice: Subject to any disclaimer, the term of this patent is extended or adjusted under 35 U.S.C. 154(b) by 0 days.

(21) Appl. No.: 18/509,200

(22) Filed: Nov. 14, 2023

(65) Prior Publication Data

US 2024/0372025 A1 Nov. 7, 2024

Related U.S. Application Data

(60) Continuation of application No. 17/080,542, filed on Oct. 26, 2020, now abandoned, which is a division of
(Continued)

(51) Int. Cl.
*H01L 31/054* (2014.01)
*F21S 11/00* (2006.01)
(Continued)

(52) U.S. Cl.
CPC ........... *H01L 31/0547* (2014.12); *F21S 11/00* (2013.01); *G01S 3/78* (2013.01); *G01S 3/7861* (2013.01);
(Continued)

(58) Field of Classification Search
CPC ............. H01L 31/0547; H01L 31/0232; H01L 31/042; H01L 31/0521; H01L 31/0543;
(Continued)

(56) References Cited

U.S. PATENT DOCUMENTS 4,023,368 A 5/1977 Kelly
4,643,545 A 2/1987 Vanderwall
(Continued)

FOREIGN PATENT DOCUMENTS

JP H02224375 A * 9/1990

*Primary Examiner* — Michael Y Sun

(57) ABSTRACT

A device for converting electromagnetic radiation into electricity comprises an expander that includes a conical shape having an axis and a curved surface that is configured to reflect electromagnetic radiation away from the axis to expand a beam of the electromagnetic radiation; and one or more energy conversion components configured to receive a beam of electromagnetic radiation expanded by the expander, and to generate electricity from the expanded beam of electromagnetic radiation. With the expander's curved surface, a beam of electromagnetic radiation that is highly concentrated—has a large radiation flux—may be converted into a beam that has a larger cross-sectional area. Moreover, one can configure, if desired, the curved surface to provide a substantially uniform distribution of radiation across the expanded cross-sectional area. With such an expanded beam the one or more energy conversion components can efficiently convert some of the electromagnetic radiation into electricity.

15 Claims, 5 Drawing Sheets

Related U.S. Application Data application No. 14/263,858, filed on Apr. 28, 2014, now Pat. No. 10,825,944.

(60) Provisional application No. 61/816,784, filed on Apr. 28, 2013.

(51) Int. Cl.

| | |
|---|---|
| G01S 3/78 | (2006.01) |
| G01S 3/786 | (2006.01) |
| G02B 3/08 | (2006.01) |
| G02B 5/00 | (2006.01) |
| G02B 17/08 | (2006.01) |
| G02B 19/00 | (2006.01) |
| G02B 21/04 | (2006.01) |
| G02B 27/09 | (2006.01) |
| H01L 31/0232 | (2014.01) |
| H01L 31/042 | (2014.01) |
| H01L 31/052 | (2014.01) |
| H02S 20/00 | (2014.01) |
| H02S 20/32 | (2014.01) |

(52) U.S. Cl.
CPC ............. *G02B 3/08* (2013.01); *G02B 5/001* (2013.01); *G02B 17/084* (2013.01); *G02B 17/086* (2013.01); *G02B 19/0023* (2013.01); *G02B 19/0028* (2013.01); *G02B 19/0033* (2013.01); *G02B 19/0038* (2013.01); *G02B 19/009* (2013.01); *G02B 21/04* (2013.01); *G02B 27/0911* (2013.01); *G02B 27/0983* (2013.01); *H01L 31/0232* (2013.01); *H01L 31/042* (2013.01); *H01L 31/0521* (2013.01); *H01L 31/0543* (2014.12); *H02S 20/00* (2013.01); *H02S 20/32* (2014.12); *Y02E 10/52* (2013.01)

(58) Field of Classification Search
CPC .......... F21S 11/00; G01S 3/78; G01S 3/7861; G02B 3/08; G02B 5/001; G02B 17/084; G02B 17/086; G02B 19/0023; G02B 19/0028; G02B 19/0033; G02B 19/0038; G02B 19/009; G02B 21/04; G02B 27/0911; G02B 27/0983; H02S 20/00; H02S 20/32; Y02E 10/52

See application file for complete search history.

(56) References Cited

U.S. PATENT DOCUMENTS

| | | | |
|---|---|---|---|
| 4,909,589 | A | 3/1990 | Morris |
| 5,574,601 | A | 11/1996 | Hall |
| 9,838,143 | B2 | 12/2017 | Chan et al. |
| 9,912,379 | B2 | 3/2018 | Hyde et al. |
| 2007/0035841 | A1 | 2/2007 | McCluney et al. |
| 2010/0309566 | A1 | 12/2010 | DeWitt |
| 2012/0174966 | A1* | 7/2012 | Snipes .................. H02S 20/32 136/246 |
| 2013/0118549 | A1 | 5/2013 | Wang He et al. |
| 2014/0246075 | A1 | 9/2014 | Goldsby |

* cited by examiner

DEVICE FOR CONVERTING ELECTROMAGNETIC RADIATION INTO ELECTRICITY, AND RELATED SYSTEMS AND METHODS

CROSS-REFERENCE TO RELATED APPLICATIONS AND PRIORITY CLAIMS

This application claims priority under 35 U.S.C. § 121 as a continuation of commonly owned U.S. patent application Ser. No. 17/080,542, filed Oct. 26, 2020, which is a divisional of commonly owned U.S. patent application Ser. No. 14/263,858, filed Apr. 28, 2014, issued Nov. 3, 2020, as U.S. Pat. No. 10,825,944, which claimed priority under 35 U.S.C. § 119(e) to commonly owned U.S. Provisional Patent Application No. 61/816,784, filed Apr. 28, 2013. Each of these previous patent applications is incorporated by reference herein.

BACKGROUND

Laser light or other monochromatic light sources can be converted into electricity using photovoltaic converters comprising an array of photovoltaic cells. Multiple cells or groups of cells may be connected in series, to raise the output voltage of the array compared to the output voltage of one cell.

When laser power is transmitted through free space, photovoltaic receivers may be physically configured similarly to solar photovoltaic arrays, using essentially flat panels of cells. In some cases, reflectors or lenses may be used to concentrate the received light onto a smaller area, increasing the light intensity and reducing the size and/or number of cells needed.

Transmission of laser power over an optical fiber to a photovoltaic receiver presents an additional challenge. The light emerging from an optical fiber is typically very intense, and forms a conical beam with a centrally-peaked, nonuniform brightness (power per unit solid angle). Systems which transmit low power (~2 W or less electrical output) over fiber have used simple planar arrays of, typically, 1-4 photovoltaic cells arranged around the beam center, so that light is evenly divided among cells (but unevenly distributed over each cell). However, this approach is practical only for small numbers of cells which can be arranged radially around a point.

Various means of expanding a laser beam from a fiber to larger area and generating a uniform intensity "top hat" beam of a desired shape are known, using, for example, axicon lenses or lenslet arrays. However, these tend to require large transmissive optical elements and long optical paths within the receiver, and in many cases yield a circular beam which is not well matched to typically square or rectangular arrays of PV cells.

It is known to focus light through an aperture into an approximately spherical cavity lined with photovoltaic cells, such that light which is reflected from or re-emitted by one cell may be captured by another cell. However, this results in highly non-uniform illumination of cells, is bulky and difficult to fabricate, and tends to require a large number of cells to cover the inside of an entire sphere.

SUMMARY

In an aspect of the invention, a device for converting electromagnetic radiation into electricity comprises an expander that includes a conical shape having an axis and a curved surface that is configured to reflect electromagnetic radiation away from the axis to expand a beam of the electromagnetic radiation; and one or more energy conversion components configured to receive a beam of electromagnetic radiation expanded by the expander, and to generate electricity from the expanded beam of electromagnetic radiation. With the expander's curved surface, a beam of electromagnetic radiation that is highly concentrated—has a large radiation flux—may be converted into a beam that has a larger cross-sectional area. Moreover, one can configure, if desired, the curved surface to provide a substantially uniform distribution of radiation across the expanded cross-sectional area. With such an expanded beam the one or more energy conversion components can efficiently convert some of the electromagnetic radiation into electricity.

In another aspect of the invention a method for converting electromagnetic radiation into electricity comprises reflecting a beam of electromagnetic radiation from a curved surface of an expander's conical shape away from an axis of the expander's conical shape to expand the beam of electromagnetic radiation; one or more energy conversion components receiving the reflected electromagnetic radiation; and one or more energy conversion components absorbing some of the energy in the reflected electromagnetic radiation to generate an electric potential across the energy conversion component.

Each of FIGS. 6A-6D illustrates a partial view of a device that includes an optical component, each according to a respective embodiment of the invention.

Figure 7:
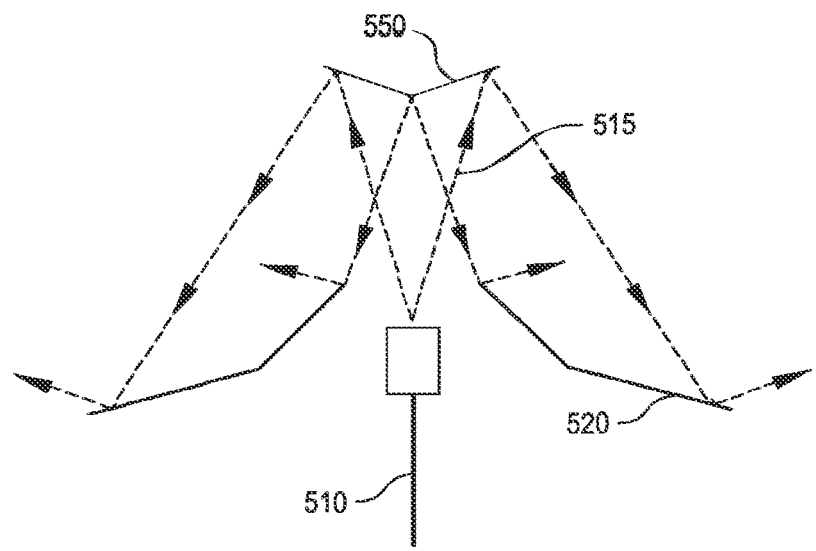

FIG. 7 illustrates a partial cross-section of a device, according to another embodiment of the invention.

Figure 8A:
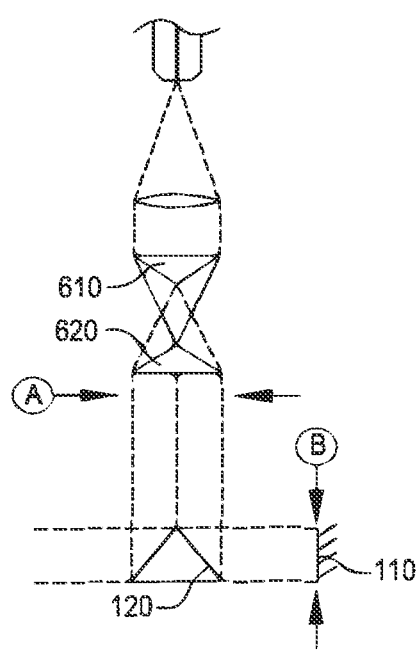

FIG. 8A illustrates a partial cross-section of a device, a partial cross-section of an electromagnetic radiation beam approaching the expander of the device, and a partial cross-section of the electromagnetic beam reflected by the expander, according to another embodiment of the invention.

Figure 8B:
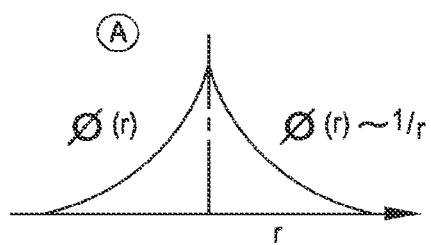

FIG. 8B graphically illustrates the distribution of the radiation within the partial cross-section of the electromagnetic radiation approaching the expander in FIG. 8A, according to an embodiment of the invention.

Figure 8C:
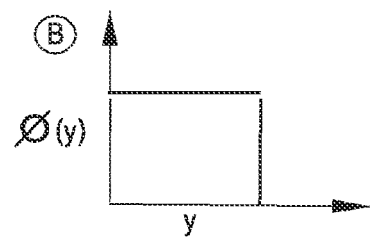

FIG. 8C graphically illustrates the distribution of the radiation flux of the partial cross-section of the electromagnetic radiation approaching the expander in FIG. 8A, according to an embodiment of the invention.

Figure 9A:
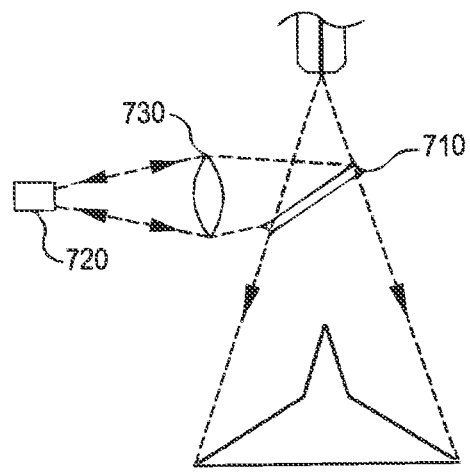
Figure 9B:
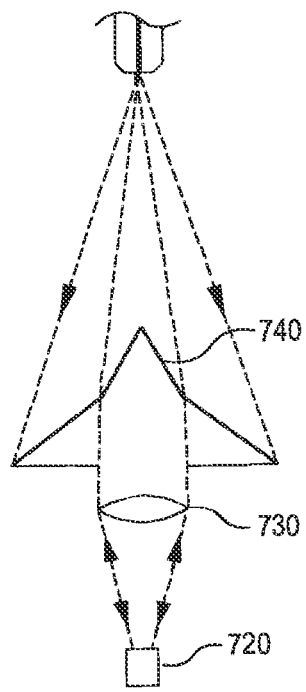

FIGS. 9A and 9B illustrates a device that incorporates an optical component for transmitting or receiving a secondary wavelength of electromagnetic radiation, according to another embodiment of the invention.

Figure 10:
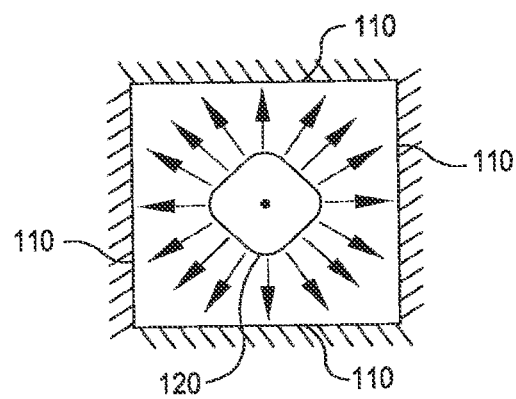

FIG. 10 illustrates a device, according to another embodiment of the invention.

Figure 11:
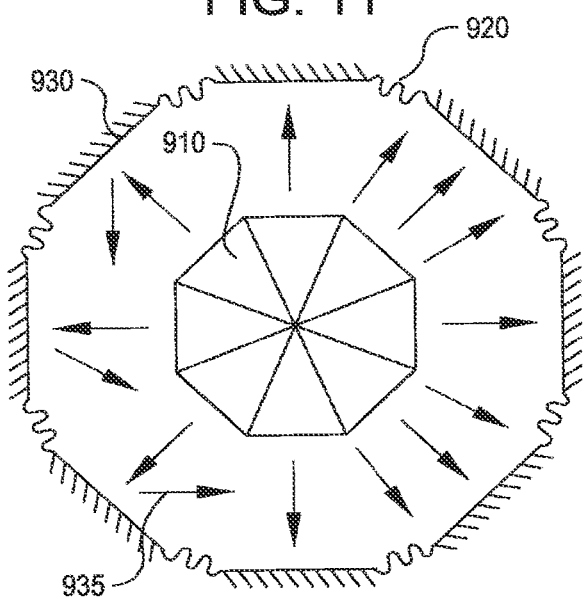

FIG. 11 illustrates a device, according to yet another embodiment of the invention.

DETAILED DESCRIPTION

Figure 1:
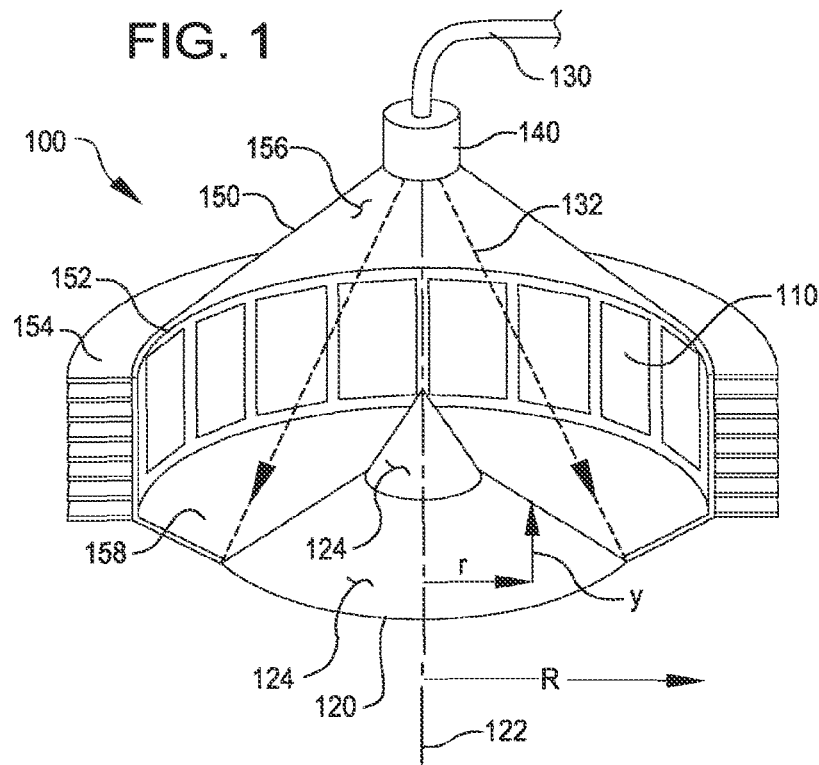
FIG. 1 illustrates a perspective, cutaway view of a device, according to an embodiment of the invention.

FIG. 1 illustrates a perspective, cutaway view of a device 100 for converting electromagnetic radiation into electricity, according to an embodiment of the invention. The device 100 comprises an expander 120 that includes a conical shape having an axis 122 (here an axis of symmetry for the conical shape) and a curved surface 124 that is configured to reflect a beam of electromagnetic radiation 132 (here emanating from the optical fiber 130) away from the axis 122 to expand the beam of electromagnetic radiation (also not shown). The device 100 also includes one or more energy conversion components 110 configured to receive the expanded beam of electromagnetic radiation, and to generate electricity from the expanded beam.

With the expander's curved surface 124, a beam of electromagnetic radiation that is highly concentrated—has a large radiation flux—can be converted into a beam that has a larger cross-sectional area. Moreover, one can configure, if desired, the curved surface 124 to provide a substantially uniform distribution of radiation across the expanded cross-sectional area. With such an expanded beam the one or more energy conversion components 110 can efficiently convert some of the electromagnetic radiation into electricity.

In this and other embodiments, the receiver 100 comprises a generally cylindrical array of energy conversion components 110 that include photovoltaic cells, arranged around a central reflective expander 120. In other embodiments, the energy conversion components 110 may include other means of converting light to electricity, such as thermoelectric or thermo-photovoltaic converters. The expander 120 receives light from an optical fiber 130 aligned with the axis 122 of the expander 120 and the photovoltaic array. An input optical assembly 140 may be used to couple light out of the optical fiber 130 and/or to shape the beam from the fiber 130, for example to increase its divergence. In some embodiments the assembly 140 may also comprise a connector allowing the optical fiber 130 to be detached from the receiver, and/or a bearing to allow the optical fiber 130 to rotate about an axis such as the axis 122 without becoming twisted.

Photovoltaic cells, as an example of an energy conversion component 110, operate most efficiently when the incident intensity of the electromagnetic radiation is even across the cell's surface. Laser sources often deliver electromagnetic radiation with an intensity profile that is not uniform, for example a Gaussian profile. In some embodiments, the expander shape may be designed to modify the electromagnetic radiation to a desired intensity profile at the surface of the energy conversion component 110, for example a flat (uniform) intensity profile. Other profiles are possible, depending on the configuration of the energy conversion component 110. For example, a gradient in intensity from top to bottom may be desired.

The expander 120 is configured to reflect the beam 132 from the fiber 130 onto the photovoltaic cells. The receiver 100 may be enclosed in a housing 150, which may comprise various elements such as the photovoltaic array support 152, a heat sink 154, and top and bottom covers 156 and 158.

In some embodiments, the energy conversion components 110 may be rigid, flat, and essentially rectangular, and the array of components may form a polygonal approximation to a section of a cylinder. In other embodiments, the components 110 may be rectangular and flexible, and may thus be curved into a true cylinder or close approximation thereto. In still other embodiments, the components 110 may have other shapes, for example triangular or hexagonal, and may tile the inner surface of the receiver 100 to form an approximation of a cylinder segment. In yet other embodiments, the array of components 110 may approximate a segment of a cone or a sphere. In such embodiments the components 110 may have shapes which efficiently cover the array area, e.g., trapezoidal shapes which fit into a section of a cone, or alternating rectangular and triangular components 110. Alternatively, the array area may be incompletely covered, e.g., by rectangular components 110 with triangular gaps between them.

Still referring to FIG. 1, the covers 156 and 158 are shown as conical but may be flat, dome-shaped, or some other shape suited to the optical and mechanical requirements of the receiver 100. Some fraction of electromagnetic radiation usually reflects off nearly any surface. In the case of an energy conversion device, reflected electromagnetic radiation would normally be lost and not available for conversion. In this and other embodiments, other surfaces in the vicinity of the expander 120 and energy conversion component 110 are reflective so that electromagnetic radiation which is not initially captured by the energy conversion component 110 can be reflected and have another chance to intersect the energy conversion component 110. For example, the interiors of the covers 156 and 158 may be partly or entirely reflective, either specularly reflective or diffusely reflective at the electromagnetic radiation's wavelength. Alternatively, part or all of the covers 156 and 158 may be covered with energy conversion components 110, such as photovoltaic cells that are either of the same type as the main energy conversion components 110, or of a different type, e.g., thin film photovoltaic cells. These components (or any subsection of the components) may be connected electrically to the main receiver array of components 110, or may be coupled to a separate electrical output, for example to drive a fan or cooling pump attached to the receiver 100.

Still referring to FIG. 1, the conical shape of the expander 120 has a profile (height y as a function of radius r) which is selected to produce a desired vertical distribution of irradiance on the energy conversion components 110, such as an approximately uniform distribution. This profile may depend on the distribution of the electromagnetic radiation within the beam 132 striking the expander 120, and the size, orientation, and location of the energy conversion components 110. While the receiver 100 is not limited to any particular size, typical dimensions for an energy conversion component 110 that includes a photovoltaic cell may range from 0.1 cm$^2$ (e.g., 3 mm×3.3 mm) to 100 cm$^2$ (e.g., 10×10 cm), with the overall radius R between roughly 1 and 10 times the width of a photovoltaic cell.

The heat sink 154 is exemplary, and may be any desired heat sink capable of cooling the energy conversion components 110, including forced-air cooling in a duct or ducts, liquid cooling, or cooling via heat pipes. Energy conversion devices often require cooling in order to maintain an appropriate temperature. Flat energy conversion receivers are limited in the amount of heat sink area per unit area of receiver because only the axis perpendicular to the plane of the receiver is available. In some embodiments of the current invention, the cylindrically symmetric receiver surface can be coupled to a heat sink that can extend in two dimensions (when the height of the cylinder is less than its diameter).

Figure 2A:
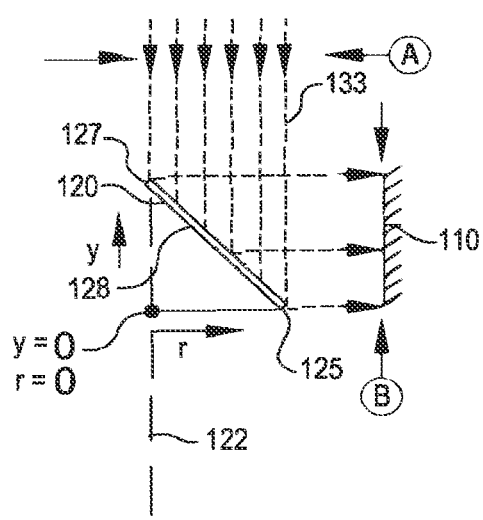
FIG. 2A illustrates a partial cross-section of a device, a partial cross-section of an electromagnetic radiation beam approaching the expander of the device, and a partial cross-section of the electromagnetic beam reflected by the expander, according to an embodiment of the invention.

FIGS. 2A-4C illustrate the effect of a conical shape 128 of an expander 120 on the distribution of irradiance (flux) on the energy conversion components 110. Each of the conical shapes 128 shown in FIGS. 2A, 3A and 4A are half of the expander's conical shape; the half of the shape not show is simply a mirror image of the shape 128 shown about the axis 122 which in these embodiments also is an axis of symmetry for the expander's conical shape. Also, in each of the FIGS. 2A, 3A and 4A, the electromagnetic radiation 133 shown approaching the expander 120 is half of the beam that the whole expander 120 expands.

Figure 2B:
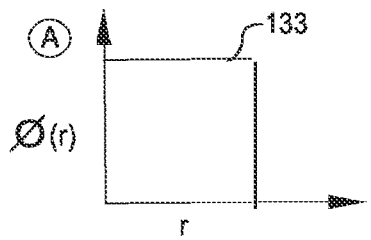
FIG. 2B graphically illustrates the distribution of the radiation within the partial cross-section of the electromagnetic radiation approaching the expander in FIG. 2A, according to an embodiment of the invention.
Figure 2C:
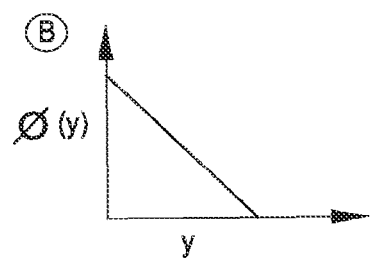
FIG. 2C graphically illustrates the distribution of the radiation flux of the partial cross-section of the electromagnetic radiation approaching the expander in FIG. 2A, according to an embodiment of the invention.

FIG. 2A-2C show the effect of reflecting a uniform "top hat" beam from a uniform cone. Each ring of radius r to r+dr illuminates an equal area of the energy conversion component 110, so the irradiance on the array goes to zero for the part illuminated by the tip 127 of the cone and is highest for the base 125 of the cone.

Figure 3A:
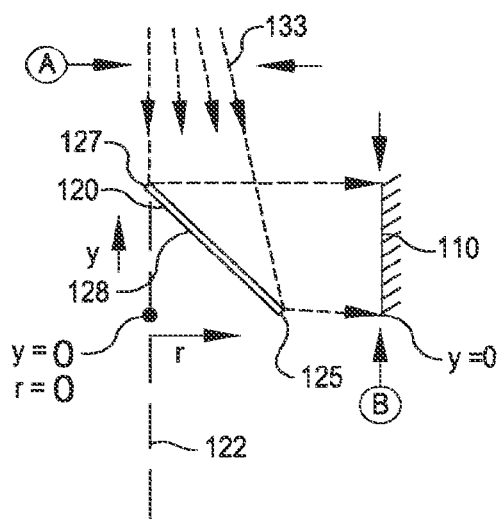
FIG. 3A illustrates a partial cross-section of a device, a partial cross-section of an electromagnetic radiation beam approaching the expander of the device, and a partial cross-section of the electromagnetic beam reflected by the expander, according to another embodiment of the invention.
Figure 3B:
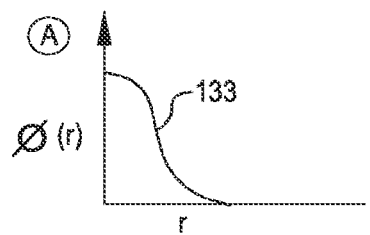
FIG. 3B graphically illustrates the distribution of the radiation within the partial cross-section of the electromagnetic radiation approaching the expander in FIG. 3A, according to an embodiment of the invention.
Figure 3C:
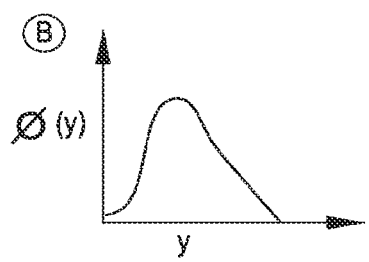
FIG. 3C graphically illustrates the distribution of the radiation flux of the partial cross-section of the electromagnetic radiation approaching the expander in FIG. 3A, according to an embodiment of the invention.

FIGS. 3A-3C show the effect of reflecting a divergent, centrally-peaked beam (approximating a Gaussian or Airy beam) from a uniform cone 128. The irradiance still goes to zero for the energy conversion component area illuminated by the tip 127 of the cone, but also falls off for the base 125 of the cone, with a maximum in between.

Figure 4A:
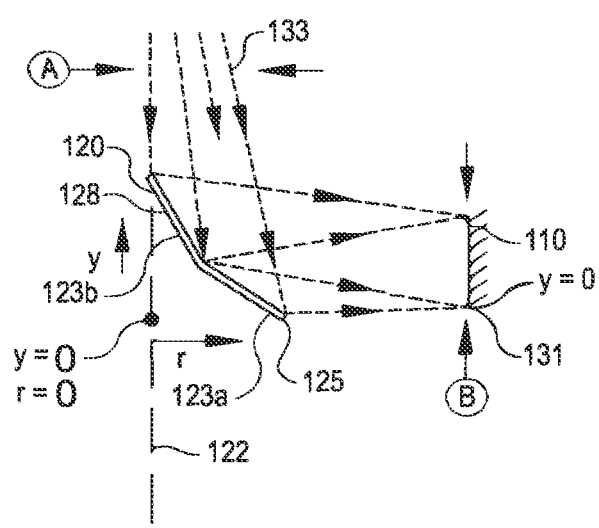
FIG. 4A illustrates a partial cross-section of a device, a partial cross-section of an electromagnetic radiation beam approaching the expander of the device, and a partial cross-section of the electromagnetic beam reflected by the expander, according to yet another embodiment of the invention.
Figure 4B:
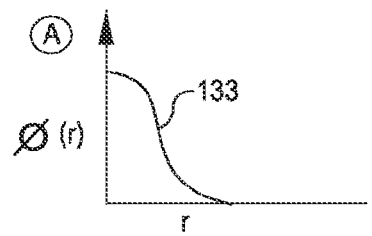
FIG. 4B graphically illustrates the distribution of the radiation within the partial cross-section of the electromagnetic radiation approaching the expander in FIG. 4A, according to an embodiment of the invention.
Figure 4C:
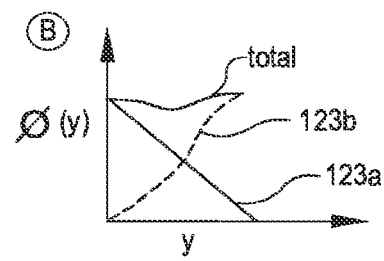
FIG. 4C graphically illustrates the distribution of the radiation flux of the partial cross-section of the electromagnetic radiation approaching the expander in FIG. 4A, according to an embodiment of the invention.

FIGS. 4A-4C illustrate an approach to making the array irradiance more uniform. By making the expander's conical shape 128 out of two or more conical segments 123a and 123b, with a total height greater than the height of the energy conversion component 110, the vertical distribution of the irradiance on the component 110 can be rearranged. As an example, the irradiance from the upper conical segment 123b (which decreases with height) can be overlaid with the irradiance from the lower conical segment 123a. To minimize the angle of incidence of the light on the energy conversion component 110, the base 125 of the expander 120 may be positioned lower than the bottom 131 of the energy conversion component 110. Depending on the divergence of the input beam 133 and the radius of the receiver 100, the height of the energy conversion component 110 may be less than, equal to, or greater than the height of the expander 120.

Still referring to FIG. 4A, the expander 120 may have three or more conical segments, allowing greater control over the irradiance distribution on the energy conversion component 110. In addition, the conical segments may be made individually convex or concave, to increase or decrease the height of the illuminated region.

In some embodiments, reflective surfaces may be used above and/or below the energy conversion component 110 to capture electromagnetic radiation, which would otherwise miss the component 110, and redirect it toward the component 110. These surfaces may be specular or diffuse reflectors. In some embodiments they may be used only to capture stray electromagnetic radiation, i.e., radiation scattered by outside of the main ray paths, e.g., by surface roughness on the expander 120. In other embodiments the main beam 133 path may be deliberately arranged to illuminate areas above and below the actual energy conversion component 110, and the reflectors may serve to redirect this light onto the components 110. In some embodiments, this may serve to further improve the uniformity of the component 110 illumination. In some embodiments, these reflective surfaces may be part of the top and/or bottom covers of the receiver housing.

The height, angles, and (if desired) curvatures of the individual cone segments can be found by trial and error, or by any of a variety of optimization techniques known in the art. Such optimizations may consider constraints on, for example, maximum and minimum irradiance on the energy conversion components 110, and may optimize for a variety of properties such as uniformity of illumination or insensitivity to misalignment of the input beam 133.

Figure 5A:
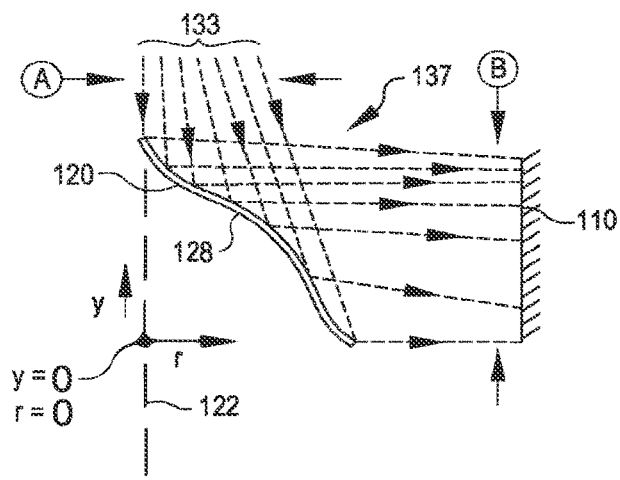
FIG. 5A illustrates a partial cross-section of a device, a partial cross-section of an electromagnetic radiation beam approaching the expander of the device, and a partial cross-section of the electromagnetic beam reflected by the expander, according to still another embodiment of the invention.
Figure 5B:
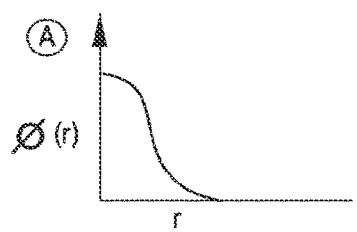
FIG. 5B graphically illustrates the distribution of the radiation within the partial cross-section of the electromagnetic radiation approaching the expander in FIG. 5A, according to an embodiment of the invention.
Figure 5C:
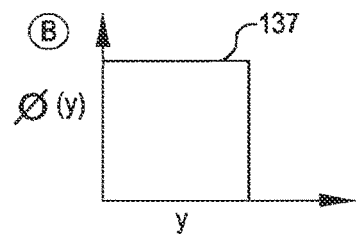
FIG. 5C graphically illustrates the distribution of the radiation flux of the partial cross-section of the electromagnetic radiation approaching the expander in FIG. 5A, according to an embodiment of the invention.

FIGS. 5A-5C illustrate an alternative approach to defining the profile of the expander 120. In this approach, the profile is locally curved to increase or decrease the vertical divergence of the radial beam 137 so that, at the energy conversion component 110 location, the irradiance is uniform (FIG. 5C) over the height of the component 110. Unlike the conical-segment approach (FIG. 4A), this approach is capable of producing a precisely-uniform distribution of irradiance of any desired height, provided the incident beam 133 profile is known.

The profile of an ideal curved expander 120 is defined by a second order differential equation. For a continuous profile and a continuous distribution of irradiance on the energy conversion component 110 (and assuming a fixed radial position R for the component 110, i.e., the component 110 is vertical) a given segment of the expander's conical shape 128 at $(r_e, y_e)$ reflects electromagnetic radiation onto a segment of the component 110 at a height $y_{ecc} = fl(r_e, y_e, y'_e)$ where $y'_e = dy_e/dr_e$). For any particular expander profile, $r_e$ can be expressed as a function of $y_e$, or vice versa. The corresponding irradiance on the component 110 is a function of the input irradiance 133 striking the expander 120 at $r_e$, and the vertical focusing or defocusing of the beam 137 by the expander 120 (corresponding to increasing or decreasing the irradiance at the component 110). This focusing is a function of the local curvature of the expander 120, proportional to $y''_e = d^2 y_e/dr_e^2$, and of the distance between the point of reflection and the component 110, which depends on $r_e$. In general form, $$\phi_{pv}[f1(r_e, y_e, y'_e)] = \phi_{in}(r_e, y_e) * f2(r_e, y'_e, y''_e)$$

Straightforward generalizations apply if the component 110 and/or the expander 120 are non-circular (R or r not constant with angle around the axis 122) or the component 110 is not vertical (R depends on $y_{ecc}$). This can be solved for any given expander 120 profile and input beam 133. However, inverting this to determine the expander 120 profile for a given input beam 133 and a desired $\phi_{ecc}$ is complex, and must in general be done numerically.

Any suitable technique may be used to fabricate the expander 120. For example, the conical-segment expander can be fabricated using conventional machining and polishing techniques suitable for flat-sided cylinders and cones. The expander 120 can also be fabricated in two or more separate pieces, each with a flat or simply-curved profile, which are then fastened (e.g., glued and/or screwed) together.

The arbitrarily-curved expander 120 may be fabricated in a variety of ways, including separately fabricating and then stacking multiple disks with appropriate diameters and flat angled or simply-curved rims. A single-piece expander 120 can also be readily fabricated using a computer-controlled lathe. The resulting part may be polished after cutting or it may have adequate surface quality as-cut.

An expander 120 may be molded in its entirety, or may be replicated using a layer of moldable material over a rigid core. A single piece mold may be used, or a two-piece mold may be used, as small seams or other imperfections will in general have little effect on the overall operation of the receiver.

Figure 6A:
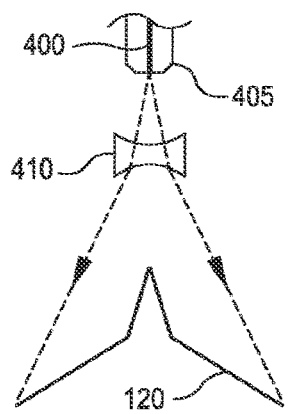
Figure 6B:
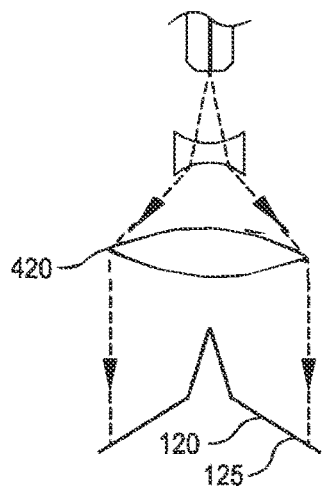
Figure 6C:
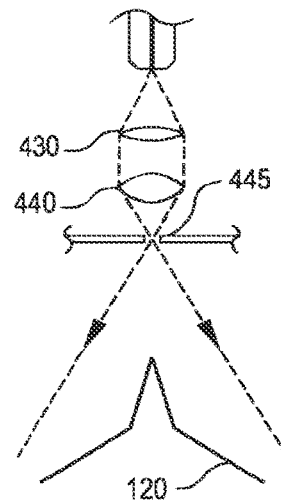
Figure 6D:
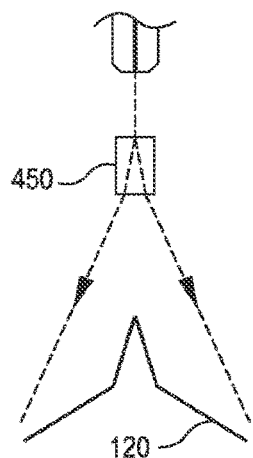

Referring now to FIGS. 6A-6D, the electromagnetic radiation from the optical fiber 130 may be coupled onto the expander 120 using a variety of optical configurations. FIG. 6A illustrates an embodiment using a simple diverging lens 410, which increases the divergence of the beam 400 from the fiber 405 and thereby shortens the distance between the fiber 405 and the expander 120 for a given expander diameter. FIG. 6B illustrates an embodiment using a collimating lens 420, which decreases the angle of incidence of the electromagnetic radiation on the base 125 of the expander 120. FIG. 6C illustrates an embodiment using a combination of a collimating lens 430 and a converging lens 440 which refocuses the electromagnetic radiation from the fiber, allowing the electromagnetic radiation to enter the receiver proper through a small aperture 445. FIG. 6D illustrates an embodiment using an optical element 450 fused directly to the end of the optical fiber, eliminating the exposed fiber end and the associated reflection of electromagnetic radiation back down the fiber, along with the risk of damage to or contamination of the fiber end. Alternatively, element 450 may be butt-coupled to the fiber, or coupled via an index-matching fluid.

FIG. 7 illustrates an embodiment where the fiber 510 enters from the bottom of the receiver (100 in FIG. 1), and the beam 515 passes through a hole in the expander 520. Electromagnetic radiation is reflected from a shallow conical reflector 550 to create a hole in the reflected beam, avoiding reflection of electromagnetic radiation back down the fiber or onto the fiber end. This also reduces the maximum intensity of electromagnetic radiation on the expander 520 itself. In other embodiments, the fiber may enter the receiver at a point other than the center of the bottom cover, and the reflector 550 may be, for example, a tilted flat reflector.

FIGS. 8A-8C illustrate an embodiment in which the beam of electromagnetic radiation is redistributed radially allowing the expander 120 to include a conical shape that is a simple straight-sided cone. Any combination of optical elements and expander shaping may be used to produce the desired vertical distribution of flux on the energy conversion component 110. For example, in some embodiments axicon optical elements 610 and 620 may be used. In other embodiments, lenses, mirrors, optical filters (wavelength filters or polarizing filters), diffusers, prisms (such as Risley prisms to steer the beam, or anamorphic prisms to change the beam diameter or shape), each of which may be fixed and/or adjustable, may be used.

Referring now to FIGS. 9A and 9B, in some cases it may be desirable to transmit or receive a second wavelength of electromagnetic radiation over the optical fiber, separate from the first wavelength being received by the energy conversion component, e.g., for communications or data transmission. In some embodiments, as shown in FIG. 9A, this second wavelength may be separated from or combined with the first wavelength by a dichroic reflector 710 incorporated into some part of the beam path. The second wavelength may be emitted or received by device 720 and focused by representative optical element 730. In other embodiments, as shown in FIG. 9B, a portion of the expander itself may be a dichroic element 740, which at least partly transmits the second wavelength while reflecting the first wavelength. Other possible optical configurations for transmitting or receiving a second wavelength will be apparent to those skilled in the art.

FIG. 10 illustrates a top view of a non-circular array of energy conversion components 110 and a corresponding non-circular expander 120. Such a non-circular array may arise because the array comprises a small number of rigid cells, or due to other constraints, for example on the space available for the receiver. The non-circular expander 120 has a radius which varies as a function of both height and rotational angle, typically with greater curvature where the array is closer to the axis, and smaller curvature where the array is farther from the axis, to provide a desired flux distribution on the energy conversion components. Such complex shapes may be fabricated by, for example, computer-controlled milling.

FIG. 11 illustrates a receiver using a pyramidal expander 910, which yields a high irradiance over a portion of the receiver circumference and negligible irradiance elsewhere. Such a configuration may be used with energy conversion components 930 which are optimized for comparatively high flux, and/or are high cost. The generally circular or polygonal configuration of the receiver allows efficient cooling of such components 930, and the expander profile may still be selected to provide uniform irradiance of the component array in the vertical direction. The space between components 930 may be filled with reflective material 920, so that light reflected or scattered from one component 930 will reflect within the receiver until it is absorbed by the same or another component 930. In some embodiments, components 930 may be deliberately oriented away from perpendicular to the receiver axis so that electromagnetic radiation 935 reflected from one component 930 will strike another component 930, or a wall of the receiver, rather than striking the expander 910 and being reflected back toward the optical fiber.

Combinations of the different expander configurations discussed above may also be used.

The preceding discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A method for converting electromagnetic radiation into electricity, comprising:
   receiving a beam of non-uniform laser light at an expander having a shape symmetric about a rotational axis and a reflective surface, wherein the reflective surface includes multiple angles relative to a line parallel to the axis, the multiple angles selected to expand the beam of non-uniform laser light into an expanded beam;
   reflecting the expanded beam from the expander toward a plurality of energy conversion components disposed to receive the expanded beam and configured to generate electricity from the expanded beam,
   wherein the multiple angles are selected to change a spatial distribution of electromagnetic energy of the beam of nonuniform laser light between the reflective surface and a member of the plurality of energy conversion components from a less uniform distribution to a more uniform distribution.

2. The method of claim 1, wherein the multiple angles are selected to cause two portions of the expanded beam to overlap at the member of the plurality of energy conversion components.

3. The method of claim 1, wherein a cross-section of the expander through the axis has a shape including curved sides, the curved sides being part of the reflective surface.

4. The method of claim 1, wherein a cross-section of the expander through the axis has a shape including sides having a plurality of straight line segments, the sides having a plurality of straight line segments being part of the reflective surface.

5. The method of claim 1, further comprising reflecting the expanded beam from a reflective surface disposed between the expander and the plurality of energy conversion components toward the plurality of energy conversion components.

6. The method of claim 1, further comprising conducting heat away from at least one of the plurality of energy conversion components with a heat sink.

7. The method of claim 1, wherein the expander is shaped to compress the height of the reflected light beam transverse to its direction of travel between leaving the expander and reaching a member of the plurality of energy conversion components.

8. The method of claim 1, wherein the plurality of energy conversion components are arranged in a polygonal prism shape.

9. The method of claim 1, further comprising modifying the nonuniform laser light before the expander expands the electromagnetic radiation.

10. The method of claim 9, wherein modifying the nonuniform laser light includes interposing an optic in the path of the nonuniform laser light, the optic including at least one of the following: a lens, a prism, a diffuser, a filter, and a mirror.

11. A method for converting nonuniform laser light into electricity, comprising:
    receiving a beam of non-uniform laser light at an expander having an axis and having a reflective surface, wherein the reflective surface has a substantially pyramidal shape characterized in that each cross-section of the shape in a plane perpendicular to the axis is a polygon having a selected number of sides, wherein the selected number of sides is the same for each cross-section of the surface, and the reflective surface includes multiple angles relative to the axis, the multiple angles selected to expand the beam of nonuniform laser light into an expanded beam; and
    reflecting the expanded beam from the expander toward a plurality of energy conversion components disposed to receive the expanded beam and configured to generate electricity from the expanded beam,
    wherein the multiple angles are selected to change a spatial distribution of the nonuniform laser light of the beam between the reflective surface and a member of the plurality of energy conversion components from a less uniform distribution to a more uniform distribution.

12. The method of claim 11, wherein the selected number of sides is the same as the number of members of the plurality of energy conversion components.

13. The method of claim 12, wherein at least one member of the plurality of energy conversion components includes a PV cell.

14. The method of claim 12, wherein at least one member of the plurality of energy conversion components includes a plurality of PV cells.

15. The method of claim 11, further comprising reflecting the nonuniform laser light from a secondary reflective surface disposed to reflect the nonuniform laser light toward the expander.

\* \* \* \* \*